United States Patent [19]

Kuo et al.

[11] Patent Number: 5,356,656
[45] Date of Patent: Oct. 18, 1994

[54] METHOD FOR MANUFACTURING FLEXIBLE AMORPHOUS SILICON SOLAR CELL

[75] Inventors: Lee-Ching Kuo, Hsinchu; Jinn-Shing King, Taipei; Wen-Yueh Hsu, Hsinchu; Yu-Tai Tsai, Taichung, all of

[73] Assignee: Industrial Technology Research Institute, Chutung, Taiwan

[21] Appl. No.: 38,176

[22] Filed: Mar. 26, 1993

[51] Int. Cl.⁵ .............................................. B05D 1/00
[52] U.S. Cl. ........................................ 427/58; 427/96; 427/109; 427/124; 427/385.5; 427/389.7; 427/578
[58] Field of Search .................. 427/58, 96, 109, 124, 427/578, 385.5, 389.7

[56] References Cited

U.S. PATENT DOCUMENTS

| | | | |
|---|---|---|---|
| 4,321,299 | 3/1982 | Frazer | 428/427 |
| 4,398,054 | 8/1983 | Madan | 427/578 |
| 4,514,583 | 4/1985 | Izu et al. | 136/259 |
| 4,543,295 | 9/1985 | St. Clair | 427/385.5 |
| 4,754,544 | 7/1988 | Hanak | 437/2 |

FOREIGN PATENT DOCUMENTS

0189976  8/1986  European Pat. Off. .
0385007  9/1990  European Pat. Off. .

OTHER PUBLICATIONS

*Mass Production Technology in a Roll-to-Roll Amorphous Silicon Solar Cell Process*; H. Morimoto et al; 1985 IEEE, pp. 1523–1528, (no month available).
*Ultralight Monolithic Photovoltaic Modules of Amorphous Silicon Alloys*; J. J. Hanak; 1985 IEEE, pp. 89–94 (no month available).
*Amorphous Silicon Alloy Tandem Devices and Modules on Thin Polyimide Substrates*; P. Nath et al; Int'l PVSEC-5,/ pp. 627–629 1990, (no month availalbe).
*Roll-to-Roll Preparation of a Hydrogenated Amorphous Silicon Solar Cell on a Polymer Film Substrate*; (1987) M. Yano et al; Thin Solid Film pp. 75–81, (no month available).
*Amorphous Silicon Solar Cells on Anodically Oxidized Aluminum Substrate*; B. Lalovic et al; Solar Cell; (1989) pp. 263–268, (no month available).
*Flexible Substrate Solar Cells*; H. Okaniwa et al; JARECT; vol. 6; Amorphous Semiconductor Technologies & Devices (1983); pp. 239–250, (no month available).
*Continuous Fabrication of Amorphous Silicon Solar Cells on Polymer Substrates*; F. R. Jeffrey; SPEI vol. 706; Photovoltaics for Commercial Solar Power Applications (1986); pp. 77–79, (no month available).
*Transparent Polymer Film Type Substrate for Amorphous Silicon Solar Cell*; A. Ishidawa et al; 1985 IEEE; pp. 487–492, (no month available).
*Ultralight Flexible Amorphous Silicon Solar Cell and Its Application for an Airplane*; Y. Kishi et al; Technical Digest of the International PCSEC-5, Kyoto, Japan, 1990; pp. 645–648, (no month available).
*A Monolithic Series-Connected Solar Cell on an Organic Polymer Film Substrate*; K. Nakatani et al; Solar Energy Materials 17 (1988); pp. 265–277, (no month available).

*Primary Examiner*—Terry J. Owens
*Assistant Examiner*—Vi Duong Dang
*Attorney, Agent, or Firm*—Christie, Parker & Hale

[57] ABSTRACT

A method of manufacturing a flexible amorphous silicon solar cell includes the steps of: a) coating a PI varnish on a glass substrate; b) imidizing the PI varnish film; c) vacuum-depositing a metal film on the PI film; d) vacuum-depositing an amorphous silicon film on the metal film; e) vacuum-depositing a transparent conducting film on the amorphous silicon film; and f) separating the PI film from the glass substrate. The method also provides for preparing the PI varnish by the steps of: 1) preparing a mixed solution of 60–100% by weight aprotic solvent, and 0–40% by weight aromatic solvent; 2) adding into the mixed solution in a mole ratio of 1:9 two aromatic diamines; and 3) further adding in the mixed solution in a mole ratio of 1:5 two aromatic dianhydrides.

6 Claims, 1 Drawing Sheet

METHOD FOR MANUFACTURING FLEXIBLE AMORPHOUS SILICON SOLAR CELL

BACKGROUND OF THE INVENTION

The present invention relates to a manufacturing method of a flexible amorphous silicon solar cell.

Solar cell is a new pollution-free energy source with applications and market demand thereof increasing steadily. It finds applications in consumer electronics products as well as in power system, and has good prospects of being one of the major energy sources. Flexible amorphous silicon solar cells are fabricated by depositing amorphous silicon, metallic and transparent conductive oxide films on a flexible substrate with the desirable features of light weight, thin thickness, flexibility, portability and nonfracture, and can be more useful than the traditional glass-substrate amorphous silicon solar cells.

There are two main types of flexible amorphous silicon solar cells, namely:

(1) The ones with metal substrate

Presently, the substrate is made of stainless steel on which there are sequentially grown metallic, amorphous silicon, and transparent conductive oxide (TCO) films, as typified by the products of ECD, Sovonics Solar System companies of the U.S.

(2) The ones having the substrate made of a polymer material

Two kinds of polymer films are used, including films of polymer materials with good transparency and those with poor transparency. The former has a very high transmission in the visible light range so that there can be sequentially grown thereon transparent conductive oxide, amorphous silicon and metal films to form a structure the same as that of the glass-substrate solar cell purchased from Sanyo Electric Co. Ltd. Amorphous silicon solar cells with the substrate made of a polymer material with poor transparency have the same structure as that of metal substrate amorphous silicon solar cells. On the amorphous silicon solar cells, there are sequentially grown metal amorphous silicon, and transparent conductive oxide films, as typified by the solar cells developed by the Iowa Thin Film Technology Inc. of the U.S., and the Sanyo Electric Co., Ltd. of Japan.

Compared with polymer substrate solar cells, metal substrate solar cells are heavy and not easily rollable. This is because it is not easy to make metal substrate thin and rollable enough. The flexible solar cells are required to be light-weight, thin as well as flexible. Although European Patent Application No. 0,109,976 filed by Sovonics Solar System has disclosed to make a very thin, light weight and flexible amorphous silicon solar cell on a very thin metal substrate ($<50\mu m$), or by etching away the metal substrate after the cell is produced, the manufacturing procedure thereof is too complicated, and the cost is too high. Solar cells with polymer substrate will be more flexible, lighter in weight, and thinner than those with metal substrate.

The polymer films suitable for being used as the substrate of solar cells should have the following characteristics: (1) good heat stability; (2) good mechanical strength; (3) surface smoothness and thickness uniformity; (4) high purity (low ion content) to avoid gas release in a high vacuum, and (5) good weatherability to avoid degrading after long time exposure to sunlight. Therefore, developing a suitable polymer material for the substrate would be one of the key techniques. Besides, the choice of the right technology for depositing the films on polymer substrate in vacuum is also critical because of the significant thermal expansion coefficient of polymer films. The right technology would ensure that the polymer substrate would not be deformed or warped, and the films deposited thereon would be even in thickness and would not be easily stripped off or cracked.

The types of polymer substrates for polymer film solar cells include:

1) polyimide (PI)-film substrate:

Most of the PI films used are those marketed under the trademark of "Kapton" from Du Pont of the U.S., having primary constituents of pyromellitic dianhydride (PMDA) and oxydianiline (ODA), and with desirable characteristics in heat resistance, mechanical strength, electrical insulation, radiation-shielding, and chemical-resistance. However, its coefficient of thermal expansion (TCE) is relatively high ($4.0\text{-}5.0 \times 10^{-5}$ cm/cm° C.) and the PI film is very soft, and when aluminum (TCE:$1.3 \times 10^{-5}$ cm/cm° C.), chromium (TCE:$6 \times 10^{-6}$ cm/cm° C.), and amorphous silicon (TCE:$1.9\text{-}4 \times 10^{-6}$ cm/cm° C.) films are deposited on the PI film in vacuum (with operation temperature up to 250° C.), there would be a stress mismatch between the PI film and the films deposited on it, resulting in the deposited films being easily stripped off and cracked, and uneven in thickness.

To alleviate the problems of warping and excessive thermal expansion coefficient of PI films used as substrate, some people tried to add a supporting layer under the PI film as disclosed in U.S. Pat. No. 4,514,583; Japan kokai Nos. 60-79779 and 60-66869; and European Patent Application No. 0,189,976 filed by Sovonics Solar System. This supporting layer is mostly a thin film of a metal. Some use fabrics or polymer material. The European Patent Application No. 0,189,796, filed by Sovonics Solar System, uses a very thin metal film on which a PI film is applied. When the films are deposited on the substrate, the supporting layer is selectively etched to get the flexible solar cell. Alternatively, the metal film can be retained as a part of the substrate. The method according to the Sovonics Solar System patent is too complicated. The composite substrate comprising a thin metal supporting layer and a PI film is still too soft, and it's thermal expansion coefficient would still be excessive, and the substrate would be warped during the a-Si:h deposition.

Supporting layer made of fabrics or glass fiber fabric would not make a good substrate since it has a surface having a roughness possibly amounting to several $\mu m$ to several ten's $\mu m$ and the PI film applied thereon will also be uneven.

2) Polyether sulfone (PES) film-substrate:

PES has a glass transition temperature of 225° C. and will easily release gas in a vacuum. Thus PES substrate (TCE) has poor characteristics and is not suitable for high efficiency device. The TCE of PES is $5.5 \times 10^{-5}$ cm/cm° C. which is even larger than that of PI and presents more difficulty in reaching the stress match between PES film and metal, amorphous silicon films and indium tin oxide (ITO, a transparent electrode material).

3) PI/MeO/PI/MeO (wherein MeO means metal oxide) multi-layer film substrate:

Laminated substrate comprising alternating PI and MeO layers would ameliorate the softness and reduce the TCE of PI substrate. However, the lamination process is too complicated. Until now, solar cells with polymer substrate and metal substrate are mostly fabricated by a roll-to-roll process to deposit the various layers on the flexible substrate in vacuum. The equipment, such as the thermal evaporator sputter or the E-Beam gun evaporator, required for depositing the metal or the transparent conductive oxide films on substrate, although having been commercialized, is very expensive. And it is complicated and difficult to adapt to roll-to-roll plasma-enhanced chemical vapor deposition (PECVD), also called glow discharge chemical vapor deposition (GD-CVD) required for depositing amorphous silicon films. Presently, no commercialized PECVD equipment available is used for the roll-to-roll operation. Users must develop the equipment required by themselves. To enhance the efficiency of the solar cells, the N, I, P layers of amorphous silicon would have to be deposited separately in three different reaction chambers (i.e. in a multichamber PECVD equipment) to avoid contaminating each other. It's very difficult to make such solar cells by the roll-to-roll process, which is still under studies now.

Therefore, the following drawbacks exist in depositing the films of polymer solar cells by roll-to-roll process: 1) The available equipment for the glass substrate solar cells cannot be utilized, and the required new equipment is not available; 2) Because the film deposition occurs in a large area, it is difficult to maintain the required flatness of the polymer substrate in this large area film deposition process. It is also difficult to control the deformation of the substrate caused by heating, resulting in expansional deformation of the films deposited and poor quality; 3) It is difficult to perform multichamber with PECVD to increase the efficiency of polymer solar cells; 4) The equipment is expensive, and consequently the production cost is high.

The kapton from Du Pont, as mentioned earlier, has a high thermal expansion coefficient and has strong adhesion between the glass substrate and the PI film deposited thereon, rendering it difficult to have the PI peeled off the substrate.

It is therefore attempted by the Applicant to deal with the above shortcomings encountered by the prior art.

SUMMARY OF THE INVENTION

It is therefore an object of the present invention to provide a simple and cost-effective method for manufacturing a flexible amorphous silicon solar cell in which the PI film/solar cell can be peeled from the glass plate, after having deposited or applied the various thin layers on the PI substrate formed on the glass plate.

Another object of the present invention is to synthesize a kind of PI used as a substrate for a flexible amorphous silicon solar cell, with a suitable thermal expansion coefficient, and characteristics different from those of the PI currently in use. Also the PI substrate with the solar cell films deposited thereon can be easily peeled off the glass plate.

A further object of the present invention is to provide a method for manufacturing a flexible amorphous silicon solar cell, whereby the existent equipment for manufacturing the glass substrate solar cells can be utilized without requiring any modification to be performed on the PECVD and laser scribing parts to effect cost saving.

DETAILED DESCRIPTION OF THE INVENTION

Figure 1:
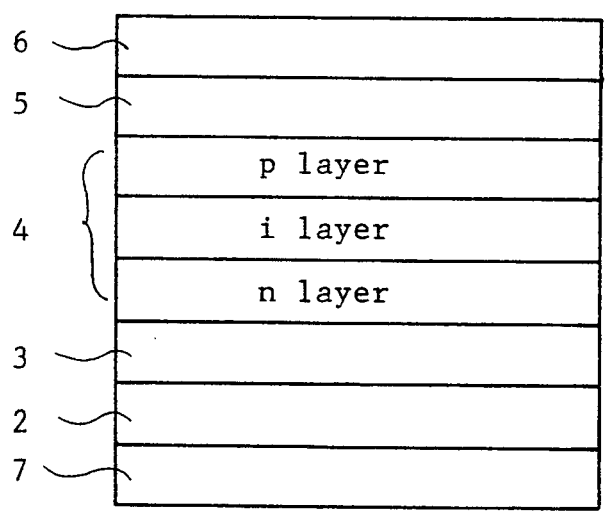
FIG. 1 is a schematical view of the solar cell according to the present invention.

According to the present invention, a method for manufacturing a flexible amorphous silicon solar cell includes the following steps: a) applying a coating of a PI varnish on a glass substrate, the varnish being polyamic acid, the precussor of polyimide; b) imidizing the PI varnish to form a PI film (2) on the glass substrate, c) depositing in vacuum a metal film (3) on the PI film and patterning it; d) depositing in vacuum an amorphous silicon film (4) on the metal film and laser scribing the silicon film; e) depositing in vacuum a transparent conductive oxide film (5) on the amorphous silicon film, and patterning it; f) applying a transparent protective coating (6) over the transparent conductive oxide film; g) separating the PI film from the glass substrate by cutting the PI film around the periphery of the glass substrate and peeling it off; and h) providing a protective film (7) on the back surface of the PI film, as shown in Fig.1. Incident light enters the solar cell through the transparent protective coating (6).

The metal films include an Al layer of 2000 Å and a Cr layer of 1000 Å. The amorphous silicon films include an n layer of 300–600 Å, an i layer of 4,000–5,000 Å, and a p layer of 100–200 Å.

When producing solar cells of large areas, every layer of the vapor deposited thin film needs to be patternized, and laser scribing is the patternizing technique known to be the most convenient, widely used and adoptable to quantity production. However, if the substrate itself is soft, it would be difficult to have it flatly spread over the scribing platform, resulting in imperfect flatness. If the substrate is not flat, the scribing result would be poor. Thus, it would be difficult to laser scribe large area solar cells without a firm, flat supporting surface beneath it. Since the present invention can directly form a PI film on a glass substrate, it is therefore possible to get a flat PI/glass substrate upon which the various layers of thin films are grown. So, the laser scribing can be carried out just as it is on an ordinary glass substrate. The equipment currently in use for glass substrate solar cells can be utilized without modifications, and cost saving is thus effected. The manufacturing method according to the present invention is easy to use. By applying a PI coating on a glass substrate, a flat PI film is spreaded thereon. The various layers of thin films deposited on the PI film will not be warped, and the stress difference between the films because of the TCE variance will be abated, and a film with good flatness and adhesion is obtained. Because the conventional PI film substrate has a relatively large thermal expansion coefficient, and after being deposited thereon various layers of thin films, it exhibits a strong adhesiveness to the glass substrate and it is difficult to be stripped therefrom. Such PI film is not suitable to be used for the present invention. The PI used for this invention is different from traditional ones, and is synthesized from a special formulation, and has all of the required characteristics mentioned above. For example, after the various layers of thin films are deposited thereon, the PI film can be easily stripped off the glass substrate. The traditional PI is synthesized by using a single species of the aromatic dianhydride, and a single species of aromatic diamine. Whereas, according to the present invention, we use two species of aromatic dianhydrides and two species of aromatic diamines to synthesize the PI. The polyamic acid serving as the precursor of the polyimide for the present flexible amorphous silicon solar cell can be synthesized as follows:

The chemical compounds used for the synthesization include:

1) an aromatic dianhydride with the structure:

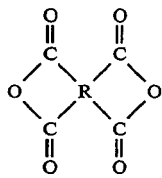

in which R is any two of the following 4 species:

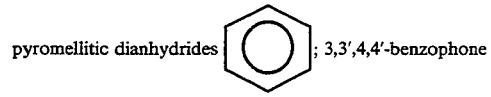

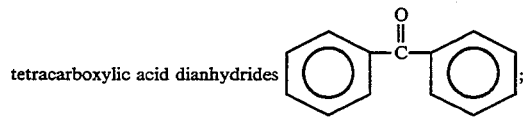

and 3,3',4,4'-biphenyl tetracarboxylic acid dianhydride

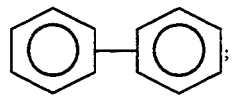

2) An aromatic diamine has the structure of H₂N—R'—NH₂, in which R' is any two of the following 7 species:

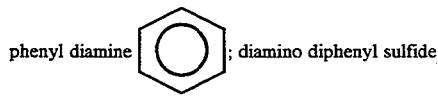

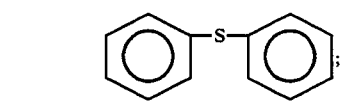

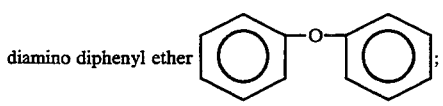

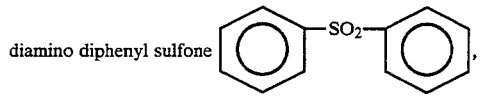

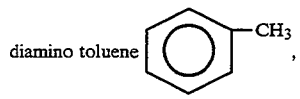

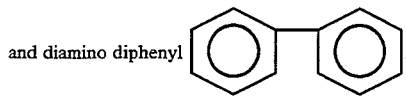

The synthesizing procedures are as follows:

1) Preparing a solution by mixing 60–100 wt % aprotic solvent and 0–40 wt % aromatic solvent. The aprotic solvent which can be used includes: (a) N-methyl-2-pyrrolidone, (b) N',N-dimethyl acetamide or (c) N,N'-dimethyl formamide. Whereas, the aromatic solvent that can be used include cyclohexanone, toluene, xylene, acetone, methylethyl ketone, or r-butyrolactone;

2) Adding into the mixed solution any two monomers of the aromatic diamines mentioned above with a molar ratio of 1:9;

3) Adding further into the mixed solution obtained any two species of the above-mentioned aromatic dianhydride with a molar ratio of 1:5. The reaction is allowed to proceed under room temperature and a nitrogen atmosphere for six hours to obtain polyamic acid, the precursor of polyimide, also known as the PI varnish which can be applied or coated on a glass substrate, by spin coating, extrusion die casting or doctor blade method. The coating is then imidized to result in a PI film with even thickness, and is flatly spreaded over the substrate with characteristics as tabulated in Table I.

TABLE I

TABLE I

1. Compounds for synthesization: BPDA/BTDA/PPDA/ODA
2. BPDA: Biphenyl tetracarboxylic acid dianhydride
3. BTDA: Benzophone tetracarboxylic acid dianhydride
4. PPDA: P-Phenyl diamine
5. ODA: Oxy dianiline
6. Mixed solvent solution: N-methyl-2-pyrrolidone (NMP)
7. The solid content of NMP/xylene: 15%
8. The solid content of NMP/toluene: 20%
9. Break-down voltage: 4500 v/mil
10. TCE: $20.5 \times 10^{-6}$ °C.$^{-1}$
11. On-set decompose temperature: 450° C.
12. Tensile strength: 13.7 kg/mm$^2$
13. Elongation: 29%
14. Dielectric strength: 3.3 (10 KHZ)
15. Volume resistivity: $>10^{16}$ Ω-cm
16. Surface resistivity: $>10^{15}$ Ω
17. Water absorption rate: 1.2% (dipped in water for 24 hours)

Table II shows the peel strength between the kapton PI (from Du Pont) film and the glass substrate. The kapton PI is synthesized essentially from the two monomers PMDA

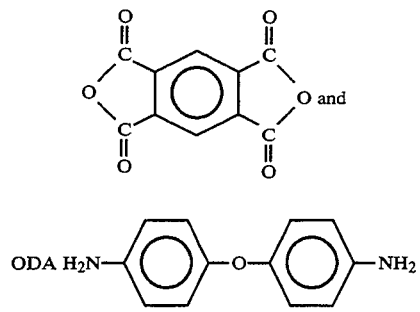

The peel strength between the kapton film and the glass substrate is 0.01 lb/in, if no film is deposited on the PI film in vacuum. The peel strength will remain unchanged if the PI filmed is just vacuum heated for a time period under the depositing temperature for depositing the metal film without actually depositing metal film. If the metal film is deposited, the peel strength will increase to 0.6. That is to say, if the adhesion between the PI film and the glass substrate is increased, we cannot perfectly separate the PI film from the substrate. The more layers of deposited films there are, the stronger the adhesion will be. For example, after depositing the metal film, amorphous silicon film and transparent conductive oxide films, the peel strength will be increased to 1.37 lb/in. And, it is then more difficult to perfectly separate the PI film from the glass. In contrast, the adhesion between the PI film according to the present invention and the glass is so small that it is out of the testing range of the tensile machine and the peel strength cannot be measured. Although the PI film is well adhered to the glass substrate during the depositing procedure, when all layers of thin films are deposited on the PI film, we can still cut the PI film around the substrate to easily separate it from the the glass substrate, in order to obtain an intact film without any cracks.

TABLE II

| filmed state of substrate | Peel strength (lb/in) |
| --- | --- |
| 1. PI film/glass (without heating in vacuum) | 0.01 |
| 2. PI film/glass (vacuum heated for a time period and at a temperature for depositing the metal film) | 0.01 |
| 3. metal film/PI film/glass | 0.6 |
| 4. transparent conductive oxide film/ amorphous silicon film/metal film/ PI film/glass | 1.37 |

Example I 6.912 g (0.064 mole) 1,4-phenyl diamine and 12.8 g (0.064 mole) 4,4-diamino diphenyl ether were fully dissolved into a mixed solvent composed of 180 g N-methyl-2-Pyrrolidone and 120 g xylene. 16.4864 g (0.0512 mole) 3,3′,4,4′-benzophenone tetracarboxylic acid dianhydride was then added into the solution obtained. Then 16.7424 g (0.0768 mole) pyromellitic dianhydride was added into the solution. After 6 hours of reaction carried out in the solution under room temperature and the nitrogen atmosphere, a tawny polyamic acid having 15% solid content was obtained. A doctor blade with a 300 μm clearance was used to apply the obtained polyamic acid on a glass substrate. The coating was then imidized at 100° C. for 30 minutes, 200° C. for 30 minutes, 300° C. for 30 minutes, and 350° C. for one hour, to obtain a PI layer having a smooth and fine surface, and a thickness of 30 μm.

Example II

On the PI/glass substrate, there were sequentially deposited by an E-Beam Gun Evaporator or a Sputter, an Al film of 2000 Å, a Cr film of 1000 Å, and by PECVD three layers (i.e. n, i, p) of amorphous silicon films having thicknesses: n:300 Å–600 Å; i:4000 Å–5000 Å; and p:100 A–200 Å. The reaction gases were the n layer: PH3 and SiH4; the i layer: SiH4; the p layer: B2H6, H2, CH4, and SiH4. The reaction temperature was 250° C., the reaction pressure was 0.3–0.5 torr, and the RF power density was 0.1 w/cm$^2$. Finally, one layer of indium tin oxide transparent electrode with a thickness of 2000 Å was deposited by an E-Beam Evaporator or Sputter, and an amorphous silicon solar cell was obtained. Then, a coating of silicon resin was applied on the amorphous silicon solar cell to form a protective film. After cutting the PI film around the substrate, the PI filmed solar cell can be peeled from the substrate.

In summary, the PI used for the present flexible amorphous silicon solar cell is synthesized from a special formulation with characteristics different from the traditional ones, and with a reasonably low TCE value. With several layers of thin films deposited thereon, the PI film can still be easily separated from the glass. The flexible amorphous silicon solar cell according to this invention, can be cost-effectively produced by making direct use of the existent equipment for producing glass substrate solar cells without any modification to be performed on the amorphous silicon depositing and laser scribing parts therein.

While the above provides a complete description of the invention, it will be appreciated that alternate modifications or equivalents may be applied without departing from the spirit and scope of the invention. Therefore, the scope of the invention is not limited by the above description, but is defined by the appended claims.

What we claim is:

1. A method for manufacturing a flexible amorphous silicon solar cell comprising following steps:
   a) applying a polyimide (PI) varnish coating on a glass substrate;
   b) imidizing said PI varnish coating to form a PI film on said glass substrate;
   c) depositing in vacuum a metal film on said PI film, and having said metal film patternized;
   d) depositing in vacuum an amorphous silicon film on said metal film, and having said amorphous silicon film patternized;
   e) depositing in vacuum a transparent electrode film on said amorphous silicon film, and having this transparent electrode film patternized;
   f) applying a transparent protective film over said transparent conducting film;
   g) separating said PI film from said glass substrate; and
   h) applying a protective film on a back side of said PI film.

2. A method according to claim 1, wherein said imidization is performed by heating said PI varnish film at 100° C. for 30 minutes, 200° C. for 30 minutes, 300° C. for 30 minutes, and 350° C. for one hour.

3. A method according to claim 1, wherein said metal film includes an Al layer of 2000 Å, and a Cr layer of 1000 Å.

4. A method according to claim 1, wherein the deposition of said amorphous silicon film is performed at 250° C., under 0.3–0.5 torr, and with a RF power density of 0.1 w/cm$^2$, and said amorphous silicon film includes an n layer of 300–600 Å, an i layer of 4,000–5,000 Å and a p layer of 100–200 Å.

5. A method according to claim 1, wherein said transparent electrode film is comprised of indium tin oxide (ITO) having a thickness of 2,000 Å.

6. A method according to claim 1, wherein the separation of said PI film from said substrate is performed by cutting said PI film around the periphery of said glass substrate and peeling said PI film off said glass substrate.

* * * * *

UNITED STATES PATENT AND TRADEMARK OFFICE
CERTIFICATE OF CORRECTION

PATENT NO. : 5,356,656  
DATED : October 18, 1994  
INVENTOR(S) : Lee-Ching Kuo; Jinn-Shing King; Wen-Yueh Hsu; Yu-Tai Tsai Page 1 of 2

It is certified that error appears in the above-indentified patent and that said Letters Patent is hereby corrected as shown below:

On the Title page, Item 56, References Cited, U.S. PATENT DOCUMENTS, change "4,321,299  3/1982  Frazer...428/427" -- 4,321,299  3/1982  Frazer...428/247 --.

Column 1, line 11, change "system" to -- systems --.
Column 1, line 29, after "material" insert a period.
Column 1, line 52, change "0,109,976" to -- 0,189,976 --.

Column 2, line 36, change "0 ,189,976" to -- 0,189,976 --.
Column 2, line 39, change "0,189,796" to -- 0,189,976 --.

Column 4, line 3, change "DRAWINGS" to -- DRAWING --.
Column 4, line 14, change "precussor" to -- precursor --.
Column 4, line 36, change "adoptable" to -- adaptable --.
Column 4, line 53, change "spreaded" to -- spread --.

Column 6, line 41, change "spreaded" to -- spread --.
Column 6, line 45, delete the second occurrence of "TABLE I".

UNITED STATES PATENT AND TRADEMARK OFFICE
CERTIFICATE OF CORRECTION

PATENT NO. : 5,356,656
DATED : October 18, 1994
INVENTOR(S) : Lee-Ching Kuo; Jinn-Shing King; Wen-Yueh Hsu; Yu-Tai Tsai It is certified that error appears in the above-indentified patent and that said Letters Patent is hereby corrected as shown below:

Column 8, line 10, change "A-200" to -- Å-200 --.
Column 8, line 11, change "PH3" to -- $PH_3$ --.
Column 8, line 11, change "SiH4" to -- $SiH_4$ -- (both occurrences).
Column 8, line 43, after "comprising" insert -- the --.
Column 8, line 67, change "A1" to -- Al --.

Column 9, line 4, before "RF" change "a" to -- an --.

Signed and Sealed this

Twelfth Day of December, 1995

Attest:

BRUCE LEHMAN

Attesting Officer

Commissioner of Patents and Trademarks